(12) United States Patent
Lung

(10) Patent No.: US 8,008,643 B2
(45) Date of Patent: Aug. 30, 2011

(54) PHASE CHANGE MEMORY CELL WITH HEATER AND METHOD FOR FABRICATING THE SAME

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 98 days.

(21) Appl. No.: 11/677,416

(22) Filed: Feb. 21, 2007

(65) Prior Publication Data
US 2008/0197334 A1      Aug. 21, 2008

(51) Int. Cl.
  *H01L 47/00*   (2006.01)
  *H01L 29/02*   (2006.01)
(52) U.S. Cl. .................. 257/2; 257/3; 257/E45.002
(58) Field of Classification Search .................. 257/2–5; 438/95
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,933,365 A * | 8/1999 | Klersy et al. ................. | 365/148 |
| 5,952,671 A | 9/1999 | Reinberg et al. | |
| 5,970,336 A | 10/1999 | Wolstenholme et al. | |
| 5,985,698 A | 11/1999 | Gonzalez et al. | |

(Continued)

FOREIGN PATENT DOCUMENTS

CN      1449021 A      10/2003

(Continued)

OTHER PUBLICATIONS

Adler, David, "Amorphous-Semiconductor Devices," Sci. Amer., vol. 236, pp. 36- 48, May 1977.

(Continued)

*Primary Examiner* — Phat X Cao
*Assistant Examiner* — Nga Doan
(74) *Attorney, Agent, or Firm* — Haynes Beffel & Wolfeld LLP

(57) ABSTRACT

A memory device with a thin heater forms a programmable resistive change region in a sub-lithographic pillar of programmable resistive change material ("memory material"), where the heater is formed within the pillar between the top electrode and the programmable material. The device includes a dielectric material layer and vertically separated top and bottom electrodes having mutually opposed contact surfaces. A sub-lithographic pillar of memory material, which in a particular embodiment is a chalcogenide, is encased within the dielectric material layer. A heater between the pillar of programmable resistive material and the top electrode forms an active region, or programmable resistive change region, next to the heater when the memory device is programmed or reset.

13 Claims, 7 Drawing Sheets

U.S. PATENT DOCUMENTS

| | | | |
|---|---|---|---|
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,859,389 | B2 | 2/2005 | Idehara |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,909,107 | B2 | 6/2005 | Rodgers et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B1 | 1/2006 | Cohen |
| 7,023,008 | B1 * | 4/2006 | Happ .............................. 257/3 |
| 7,042,001 | B2 | 5/2006 | Kim et al. |
| 7,132,675 | B2 | 11/2006 | Gilton |
| 7,486,536 | B2 | 2/2009 | Kim et al. |
| 2004/0248339 | A1 | 12/2004 | Lung |
| 2005/0093022 | A1 | 5/2005 | Lung |
| 2005/0215009 | A1 | 9/2005 | Cho |
| 2006/0169968 | A1 * | 8/2006 | Happ .............................. 257/2 |
| 2008/0006811 | A1 * | 1/2008 | Philipp et al. ..................... 257/4 |
| 2008/0197334 | A1 * | 8/2008 | Lung .............................. 257/2 |

FOREIGN PATENT DOCUMENTS

| | | |
|---|---|---|
| CN | 1892889 A | 1/2007 |
| CN | 1898750 A | 1/2007 |
| WO | WO 00/45108 A1 | 8/2000 |
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al, "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, Vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam at al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. at al., "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino at al., "Reliability Study of Phase-Change Nonvolatile Memories," IEEE Transactions on Device and Materials Reliability, Sep. 2004, pp. 422-427, Vol. 4, No. 3.

Prakash, S. at al., "A Guideline for Designing Chalcogenide-Based Glasses for Threshold Switching Characteristics," IEEE Electron Device Letters, vol. 18, No. 2, Feb. 1997, pp. 45-47.

Radaelli, A. at al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., Vol. 106, 1998, pp. 21-26.

* cited by examiner

PHASE CHANGE MEMORY CELL WITH HEATER AND METHOD FOR FABRICATING THE SAME

PARTIES TO A JOINT RESEARCH AGREEMENT

International Business Machines Corporation, a New York corporation; Macronix International Corporation, a Taiwan corporation; and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices, and most particularly to a phase change memory element with a heater.

2. Description of Related Art

Phase change based memory materials are widely used in nonvolatile random access memory cells. Such materials, such as chalcogenides and similar materials, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

The change from the amorphous to the crystalline state is generally a low current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued 11 Nov. 1997; Zahorik et al., "Method of Making Chalogenide [sic] Memory Device," U.S. Pat. No. 5,789,277, issued 4 Aug. 1998; Doan et al., "Controllable Ovonic Phase-Change Semiconductor Memory Device and Methods of Fabricating the Same," U.S. Pat. No. 6,150,253, issued 21 Nov. 2000.

A particular problem encountered in the prior art has been controlling the operating current, and the heat generated by that current. The phase change process proceeds by joule heating of the phase change material, which produces two problems. First is sufficient current to program or erase a memory unit, which can have billions of individual memory cells (as a unit offering storage capacity in the gigabyte range clearly does). Second, the heat generated by heating the phase change material has the potential at least to degrade a memory unit, if not destroy it altogether. Similarly, heating the phase change material can result in a phase-change region that is larger than necessary to produce a logic state change, which uses extra current and creates extra heat.

It is desirable therefore to provide a memory cell structure having a reduced current requirement and reduced phase change volume. It is further desirable to provide a manufacturing process and a structure, which are compatible with manufacturing of peripheral circuits on the same integrated circuit.

SUMMARY OF THE INVENTION

A memory device has top and bottom electrodes, a sub-lithographic pillar of memory material disposed between the bottom electrode and the top electrode, and a thin heater disposed within the pillar and between the sub-lithographic pillar of memory material and the top electrode. The memory material is programmable to a plurality of resistive states by heating. The heater is made of a heater material having a resistivity greater than that of the top electrode material and greater than that of the memory material in its most highly resistive state. The sub-lithographic pillar of memory material has an active region where the programmable resistive change primarily occurs, that is selectively programmable by resistively heating the heater so as to convert the programmable resistive change region from a first resistive state to a second resistive state. The programmable resistive change active region is confined to a part of the sub-lithographic pillar adjacent to the heater.

In a particular embodiment, the memory material is a chalcogenide, such as GST, which is a combination of Ge, Sb, and Te. The sub-lithographic pillar of memory material has a height of between about 20 and 120 nm, and in one example, has a height of about 80 nm. Other memory materials include a combination of two or more materials from the group of Ge, Sb, Te, Se, In, Ti, Ga, Bi, Sn, Cu, Pd, Pb, Ag, S, and Au. In some embodiments, the heater and the sub-lithographic pillar of memory material have the same diameter.

In a particular embodiment, the top electrode comprises a bit line. In a further embodiment, the bit line is disposed on the heater. In particular embodiments, the heater material includes at least one of silicon carbide, graphite, tantalum nitride, tantalum-aluminum nitride, tungsten nitride, aluminum oxide and tantalum oxide.

In another embodiment, a memory device is constructed by providing a substrate including dielectric material having a bottom electrode formed therein with an upper surface exposing the bottom electrode. A sub-lithographic pillar of memory material is formed above and electrically coupled to the bottom electrode. A dielectric fill layer is deposited on the upper surface to surround the sub-lithographic pillar of memory material. The dielectric fill layer is planarized to expose a top surface of the sub-lithographic pillar of memory material even with a top surface of the dielectric fill layer. A first portion of the sub-lithographic pillar of memory material is removed to form a heater pocket above a remaining portion of the sub-lithographic pillar of memory material and below the top surface of the dielectric fill layer. The heater pocket is filled with heater material to form a heater. A conductive layer is deposited above and electrically coupled to the heater. In a further embodiment, the conductive layer is patterned to form a bit line.

In yet another embodiment, a memory device is operated by providing a structure including a top electrode electrically coupled to a bottom electrode through a heater and a sub-lithographic pillar of memory material, the sub-lithographic pillar of memory material having a phase change region next to the heater and flowing electric current between the top electrode and the bottom electrode so as to melt a first portion of the sub-lithographic pillar of memory material including the phase change region proximate to the heater and not melt a second portion of the sub-lithographic pillar of memory material distal from the heater

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

With regard to directional descriptions herein, the orientation of the drawings establish their respective frames of reference, with "up," "down," "left" and "right" referring to directions shown on the respective drawings. Similarly, "thickness" refers to a vertical dimension and "width" to the horizontal. These directions have no application to orientation of the circuits in operation or otherwise, as will be understood by those in the art.

There follows a description of an integrated circuit and memory array according to an embodiment, an example of a conventional memory cell, and embodiments of phase change elements and memory cells of the present invention, after which the process for fabricating them are discussed.

Figure 1:
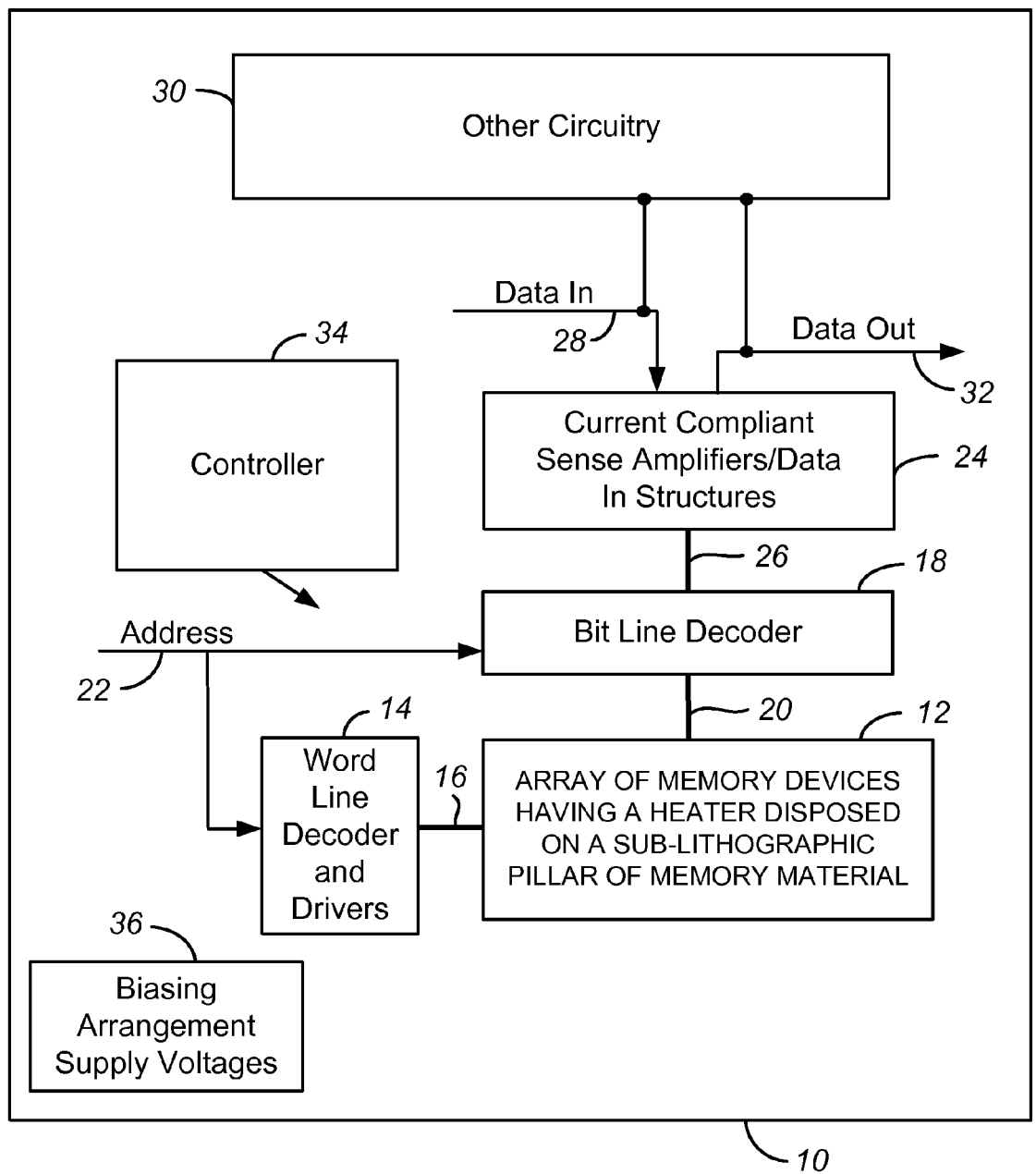
FIG. 1 is a block diagram of an integrated circuit device in accordance with the present invention.

Referring to FIG. 1, shown is a simplified block diagram of an integrated circuit 10 in which the present invention may be implemented. Circuit 10 includes a memory array 12 implemented using phase change memory cells (not shown) including at least one memory cell according to an embodiment of the invention on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
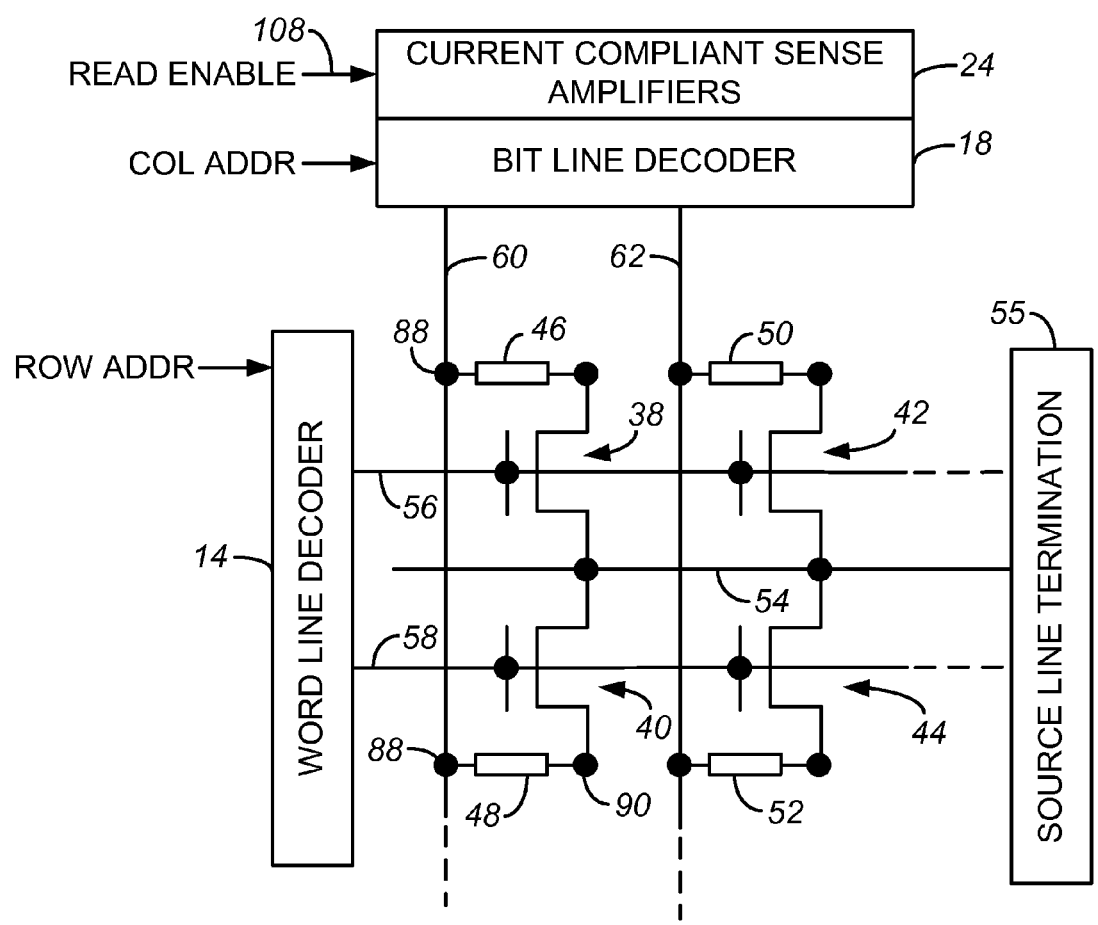
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the access devices are not electrically connected, but independently controllable. A plurality 16 of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 extend in parallel along a second direction and are connected to one end of the phase change elements, for example phase change elements 46 and 48 connected to bit line 60. Specifically, phase change element 46 is connected between the drain of access transistor 38 and bit line 60, and phase change element 48 is connected between the drain of access transistor 40 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source.

Figure 3:
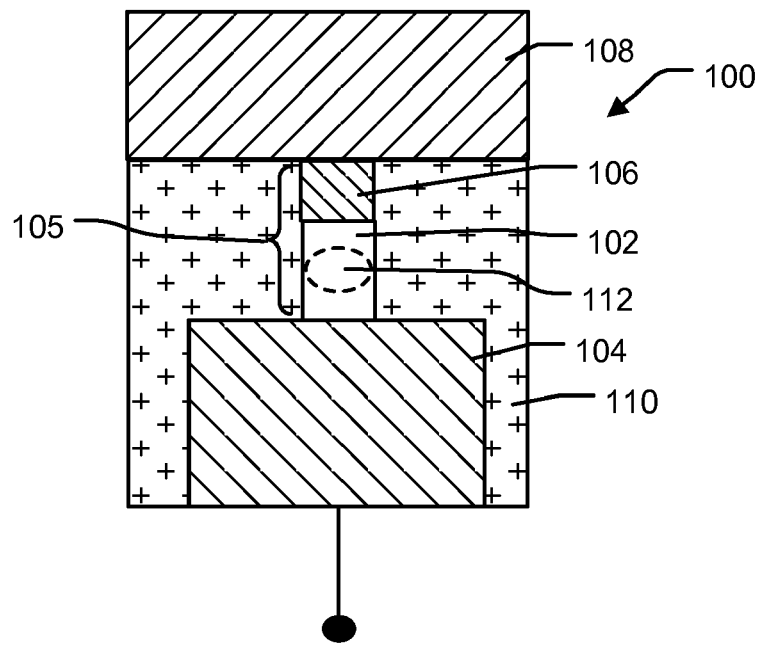
FIG. 3 illustrates a prior art phase change memory element.

FIG. 3 illustrates a prior art phase change memory element 100. The phase change memory element 100 has a pillar of phase change memory material 102 extending between a plug element 104 (bottom or first electrode), which is electrically connected to a word line (not shown) through a selection device, such as a diode or transistor, and a top (second) electrode 106 that is electrically connected to a bit line 108. As is known in the art, memory cells are often controlled via two sets of data lines, arranged orthogonally. Word lines are energized to select a specific data word address, while bit lines select a specific bit within that word. Those lines are conventionally laid out in perpendicular arrays. The memory cell of which the present invention is a part can be configured such a layout, with bit line 108 forming the top level of the phase change memory element and the word line (not shown) lying perpendicular to the bit line. The word line signal connects the plug element 104 to a current path used for reading and writing. The conductive material of the plug element 104, bit line 108 and word line (not shown) can be tungsten, copper, aluminum or other materials and combinations deemed suitable in the art for plug and line structures generally.

Other layers are optionally used between the pillar of phase change memory material 102 and the plug element 104, such as to promote adhesion to the phase change material, good electrical conductivity, and to provide a diffusion barrier between the phase change memory material 102 and the plug element 104, but are omitted for simplicity of illustration and discussion. Such layers preferably are made up of TiN or TaN. Alternatively, the layers may be TiAlN or TaAlN, or may comprise, for further examples, one or more elements selected from the group consisting of Ti, W, Mo, Al, Ta, Cu, Pt, Ir, La, Ni, and Ru and combinations thereof. The conductive layers preferably extend across the width of the plug element 104.

The pillar of phase change material 102 is composed of a phase change alloy that is capable of being switched between a first structural state in which the material is in a generally amorphous solid phase, and a second structural state in which the material is in a generally crystalline solid phase in its local order in the active channel region of the cell. Phase change alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of a PCRAM described herein is $Ge_2Sb_2Te_5$., which is commonly referred to as "GST".

The pillar of phase change material 102 is deposited as a film layer. Above the pillar of phase change material 102 lies the second (top) electrode 106, at least covering the upper surface of the pillar of phase change material 102. The second electrode 106 can also be formed of TiN, as discussed above. It is convenient to refer to the pillar of phase change material 102 and second electrode 106 jointly, which unit hereafter will be referred to as the phase change core 105.

The phase change core 105 is formed in a cylindrical hole (pore) of dielectric material 110 or is formed as a pillar using a directional etch technique, with the dielectric material 110 being deposited to fill-in around the pillar. The dielectric material 110 preferably consists of one or more layers of silicon dioxide or other dielectric insulator materials.

In operation, a current path exists between the bottom electrode 104 and bit line 108. As the current flows though the phase change material 102, joule heating causes the temperature of the phase change material in a phase change region 112 to rise, and, as explained above, based on the length and amplitude of the current pulse, the element can be placed in a SET or RESET condition.

The active phase change region 112 occurs essentially in the middle region of the pillar of phase change material 102 because the top and bottom electrodes 106, 104 are typically good thermal conductors (e.g. metal(s)), and draw heat away from the ends of the pillar of phase change material 102 during programming. Thus, the hottest portion of the pillar of phase change material 102 occurs between the thermal sinks created by the plug 104 and bit line 108. During a reset operation, the entire pillar of phase change memory material 102 is melted, which requires significant power and develops significant heat in the memory array, especially when several memory cells are being reset. If it is desired only to read the state of the phase change material, a relatively lower current pulse is employed, sufficient to determine the resistance of the material. Control of access to the memory cell is provided by control elements, preferably access transistors (see FIG. 2).

Figure 4:
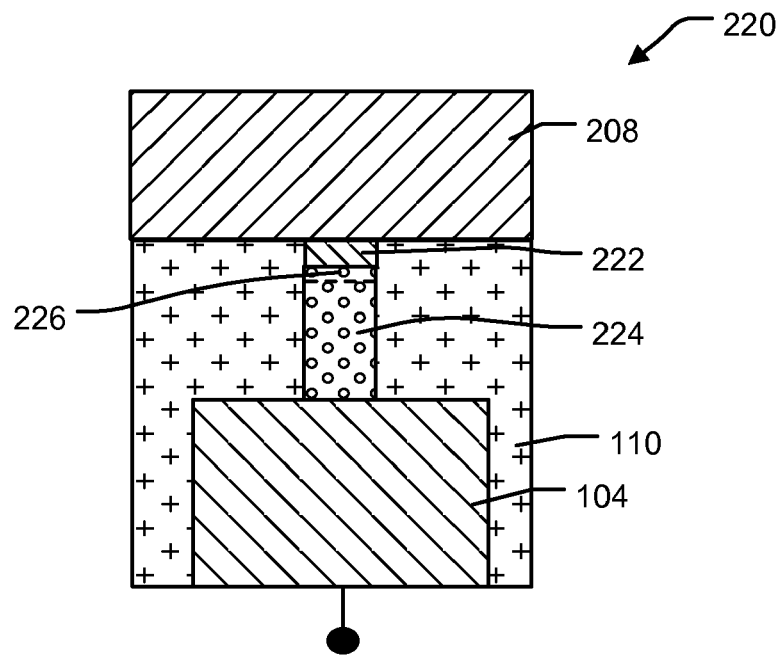
FIG. 4 illustrates a programmable resistive memory element with a top heater according to an embodiment of the present invention.

FIG. 4 illustrates a programmable resistive memory element ("memory device") 220 with a top heater 222 according to an embodiment of the present invention. A pillar of programmable resistive material ("memory material") 224, such as a chalcogenide, is encased in a dielectric material layer 110, such as silicon dioxide.

Chalcogenides include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, $ZrO_x$, or other material that uses an electrical pulse to change the resistance state; TCNQ, PCBM, TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

The top heater 222 is formed on top of the pillar of memory material 224 from heater material, such as SiC, C (graphite), TaN, WN, TaAlN, or very thin dielectric materials, such as 1 nm to 2 nm of aluminum oxide or tantalum oxide. The heater material has resistivity that is higher than the resistivity of the memory material in its most resistive state and also higher than the resistivity of the top electrode 208. A top electrode 208 may comprise W, TiN, or Cu, for example. In particular embodiments, the top electrode 208 is patterned as a bit line of a memory device.

The programmable resistive memory element 220 is set or reset by flowing current between the top electrode 208 and lower electrode 104 through the heater 222 and pillar of memory material 224. The heater 222 efficiently converts the current to heat, forming a programmable resistive change region 226 in the programmable memory material 224 next to the heater 222. The heater reduces the power needed for reset because only the portion of the memory material next to the heater needs to be melted, which in turn reduces the heat generated in the memory device. Advantages to including a heater in a programmable resistive memory cell include controllability, reliability of programming, and the durability of the cell defined by the reliable number of set and reset cycles.

In order to write to memory element 220, for example, appropriate enabling signals would be coupled to the top electrode 208 and the lower electrode 104. The amount and duration of the resulting current is selected to cause the material in the programmable resistive change region 226 to melt and then assume either a higher or lower resistive state after cooling. Reading the memory element would proceed by passing a low level current pulse though the element and sensing its resistance.

Figure 5:
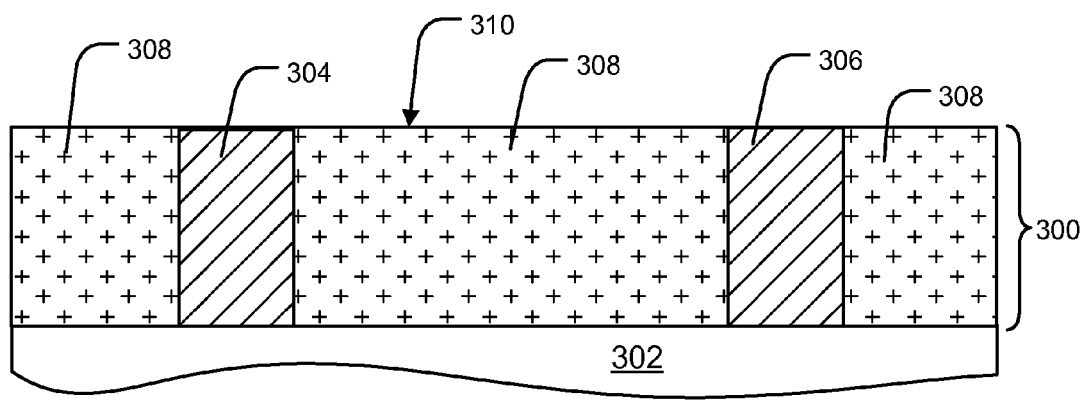
FIGS. 5-11 illustrate steps in a fabrication sequence of a programmable resistive memory cell with a top heater according to an embodiment of the invention.

FIGS. 5-11 illustrate steps in a fabrication sequence of a programmable resistive memory cell with a top heater according to an embodiment of the present invention. FIG. 5 shows a memory cell access layer 300 formed on a semiconductor substrate 302. Access layer 300 typically comprises access transistors (not shown). Other types of access devices, such as diodes, may also be used. Access layer 300 comprises first and second plugs 304, 306 within a dielectric film layer 308. First and second plugs 304, 306, which will act as bottom electrode elements, are typically made of tungsten, polysilicon or TiN. Memory cell access layer 300 has an upper surface 310 exposing the plugs (bottom electrodes) 304, 306.

Doped regions in the semiconductor substrate 302 act as terminals of access transistors including the word lines (not shown) as gates for coupling the bottom electrodes 304, 306 to a common source line (not shown). The doped regions (not shown) are preferably formed in a conventional manner, and a detailed description is therefore omitted.

Figure 6:
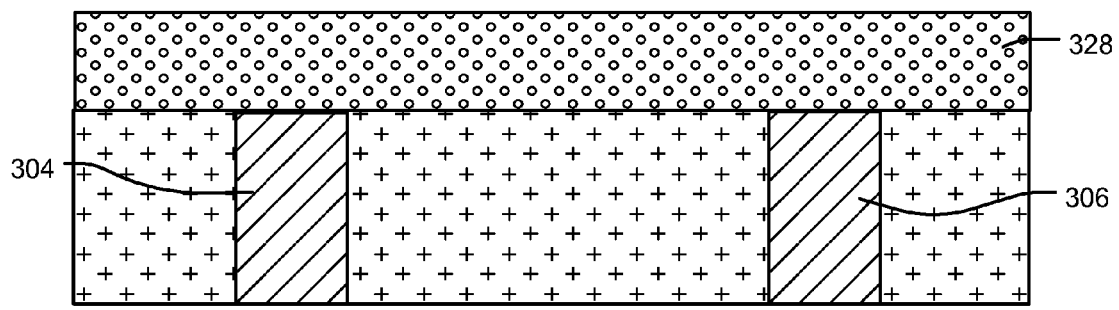

FIG. 6 shows a layer of programmable resistive memory material (e.g. GST) 328 deposited on the upper surface (see FIG. 5, ref. num 310). The layer of programmable resistive memory material 328 is preferably about 20 nm to about 120 nm thick, typically about 80 nm thick. Other materials for the memory layer 328 are alternatively used. In alternative embodiments, additional steps are performed, such as planarizing the upper surface to remove dimples (seams) in the plugs 304, 306, or additional features, such as a barrier layer (not shown) between the plugs 304, 306 and the programmable resistive memory material 328, are included. In a particular embodiment, the upper surface is planarized, and then the plugs are etched back to form cavities, which are then filled with barrier material and planarized, providing a flat, compatible surface for the programmable resistive memory material 328. Such techniques are well known in the art and are omitted for simplicity and clarity of illustration and discussion.

Figure 7:
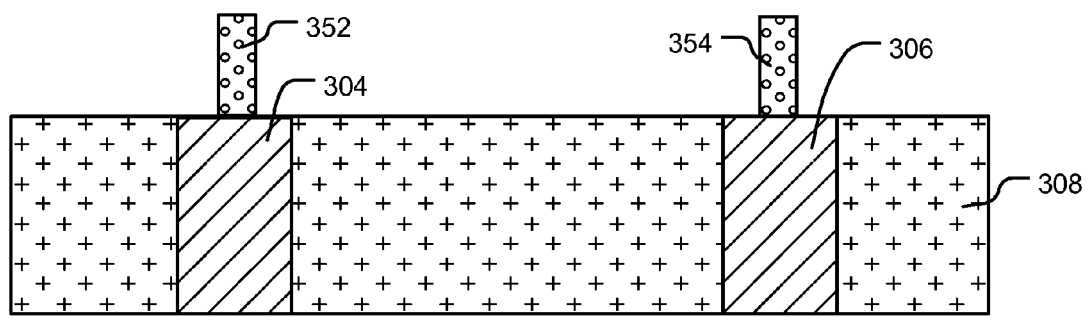

FIG. 7 illustrates the results of etching the programmable resistive memory material to form pillars 352, 354 of programmable resistive memory material. A lithographic mask and etch technique is used in a particular embodiment to form the pillars 352, 354. The lithographic mask typically has a lateral dimension about equal to the minimum lithographic feature size for the lithographic process used. To reduce the lateral dimension of the lithographic mask, a mask trimming procedure is undertaken, the results of which creates a trimmed lithographic mask with a reduced feature size smaller than the nominal minimum lithographic feature sized defined on the mask. In one embodiment, the reduced feature size is about 40 nm. An etching process employed in one embodiment is a dry anisotropic etch using a reactive ion etching RIE, utilizing argon, fluorine or oxygen plasma chemistry. An optical emission tool may be used to identify and control the end point of the etch when the upper surface of the bottom electrodes 304, 306 or dielectric film layer 308 is encountered.

During conventional etching steps, resistive programmable pillars may be undercut, thus weakening the resulting memory element. The resistive programmable material and etching technique may be selected to avoid undercutting, as described in co-pending and commonly owned U.S. patent application Ser. No. 11/456,922, entitled Method for Making a Pillar-Type Phase Change Memory Element, filed 12 Jul. 2006 by Hsiang-Lan Lung and Chia Hua Ho, the disclosure of which is hereby incorporated by reference in its entirety for all purposes.

In alternative embodiments, a layer of hard mask material other than the material of the top electrode, such as SiO2 or SiN, is formed over the memory material, to protect the top surface during etching.

Figure 8:
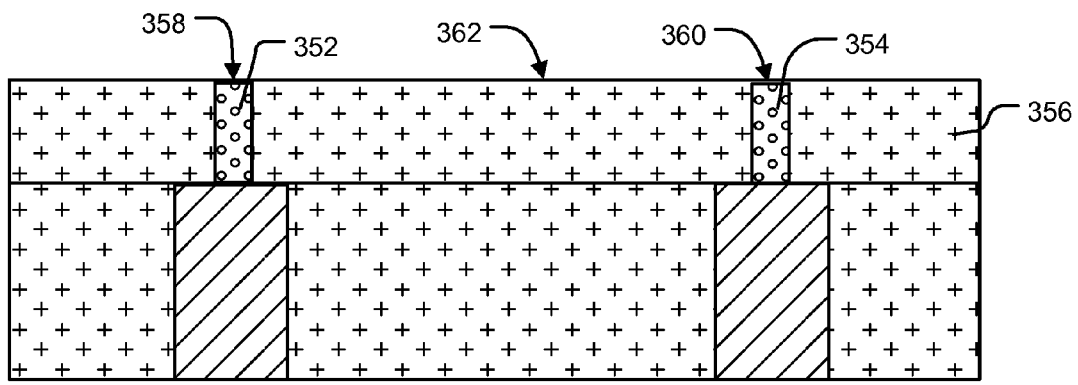

FIG. 8 shows a dielectric fill layer 356 deposited over the pillars of memory material 352, 354 and planarized (e.g. using a CMP technique) so that the top surfaces 358, 360 of the pillars 352, 354 are even with the top surface 362 of the dielectric fill layer 356. Representative materials for the dielectric fill layer 356 include materials that are a combination of the elements silicon Si, carbon C, oxygen O, fluorine F, and hydrogen H and provides electrical isolation between memory elements. In some embodiments, the isolation material comprises a thermally insulating material, such as $SiO_2$, SiCOH, polyimide, polyamide, and fluorocarbon polymers. Generally, a thermally insulating material should have a thermal conductivity less than that of $SiO_2$, or less than about 0.014 J/cm*degK*sec.

Many low-K materials, where low-K materials have permittivity less that that of $SiO_2$, are suitable for use in the dielectric fill layer 356, and include fluorinated $SiO_2$, silsesquioxane, polyarylene ethers, parylene, fluoro-polymers, fluorinated amorphous carbon, diamond-like carbon, porous silica, mesoporous silica, porous silsesquioxane, porous polyimide, and porous polyarylene ethers. A single layer or combination of layers can provide thermal isolation. Silicon nitride or other materials having higher thermal conductivity than SiO$_2$ may be used when thermal conductivity is not critical.

In one embodiment, the dielectric fill layer 356 is formed to a depth exceeding the height of the pillars (see FIG. 7, ref. nums. 352, 354) and then planarized using a CMP process to expose the top surfaces 358, 360 of the pillars 352, 354.

Figure 9:
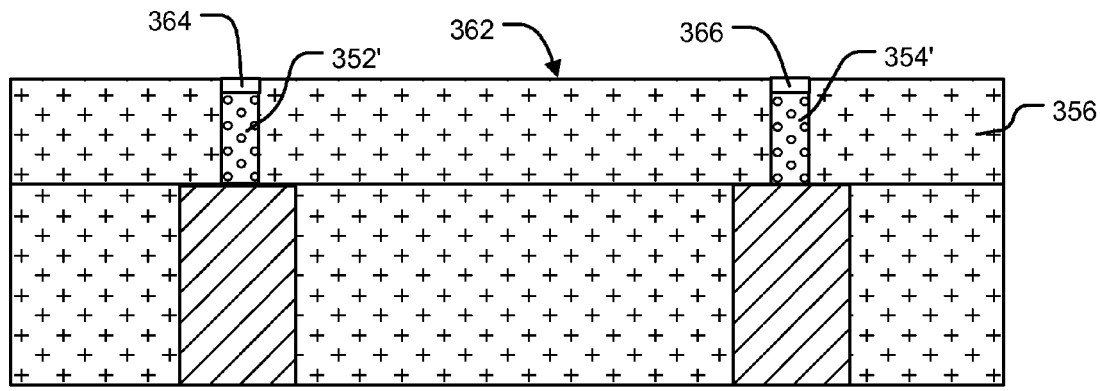

FIG. 9 shows the pillars of memory material 352', 354' after etching to form heater pockets 364, 366. The heater pockets 364, 366 are recesses formed below the top surface 362 of the dielectric fill layer 356 using an etch technique that preferentially etches the memory material (e.g. GST) relative to the dielectric fill material 356 (e.g. SiO$_2$), using for example a RIE with chlorine based plasma.

Figure 10:
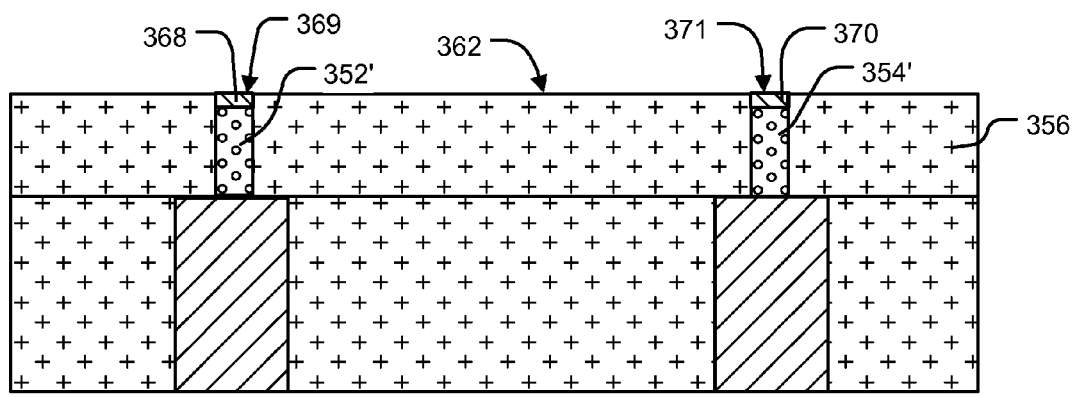

FIG. 10 shows heaters ("top heaters") 368, 370 formed on the pillars of memory material 352', 354'. In particular embodiments, the heaters 368, 370 are formed by depositing heater material, such as SiC, C (graphite), TaN, Wn, TaAlN, or very thin dielectric materials, such as 1 nm to 2 nm of aluminum oxide or tantalum oxide, to fill the heater pockets (see FIG. 9, ref. nums. 364, 366), and then using a CMP or other technique to planarize the top surfaces 369, 371 of the heaters 368, 370 to the top surface 362 of the dielectric fill layer 356. In alternative embodiments, the heaters 368, 370 can be formed by partially filling the heater pockets, and then using a CMP or other technique to remove excess material from the top surface 362 of the dielectric fill layer 356. Alternatively, the CMP step is omitted. The heaters 368, 370 have a resistivity higher than the resistivity of the phase change material in its most resistive state and higher than the resistivity of the top electrode (see FIG. 11, ref. num. 372). The thickness of the heaters 368, 370 (e.g. 10 to 50 nm, typically 20 nm) should be low enough to prevent too high a heater resistance.

Figure 11:
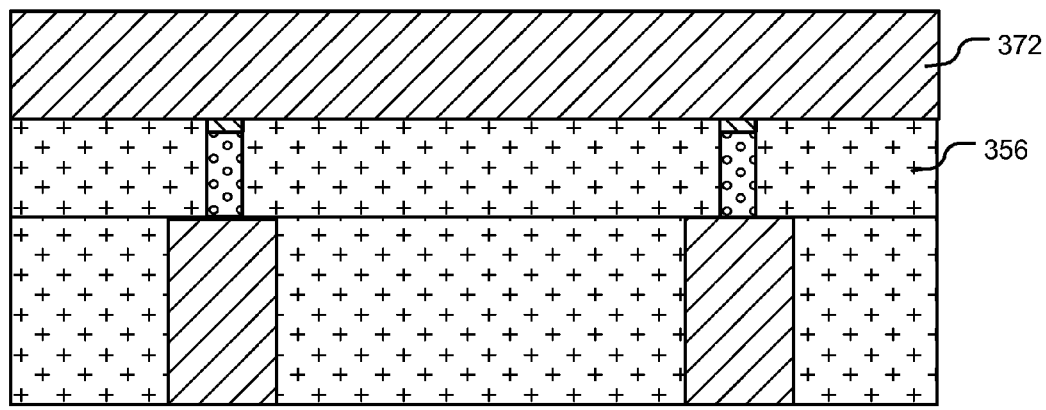

FIG. 11 shows a conductive layer 372 formed over the dielectric fill layer 356 and electrically coupled to top heaters 368, 370. This layer 372 is preferably formed of TiN, aluminum, copper, tungsten, or other suitable materials, as discussed in connection with other conductive layers, and in one embodiment is patterned as a bit line of a memory array. In the illustrated embodiment conductive layer 372 forms the top electrode of the memory devices. An integrated circuit incorporating the memory cell of FIGS. 5-11 is completed using techniques familiar to those of skill in the art.

In a particular embodiment, a memory device having a top electrode electrically coupled to a bottom electrode through a heater and a sub-lithographic pillar of memory material is set or reset by flowing electric current between the top electrode and the bottom electrode so as to melt a first portion of the sub-lithographic pillar of memory material including a phase change region proximate to the heater and not melt a second portion of the sub-lithographic pillar of memory material distal from the heater. The combination of a heater with a sub-lithographic pillar of memory material is particularly desirable because of the low power (current) required to reset the memory cell. This in turn generates less heat in the memory device, which is particularly desirable to minimize heating of a memory array when many memory cells are reset simultaneously or within a short period.

Those in the art will understand that a variety of alternatives and embodiments can be fashioned, all lying within the spirit of the invention disclosed herein. The invention itself, however, is defined solely in the claims appended hereto.

What is claimed is:

1. A memory device comprising:
a bottom electrode;
a dielectric fill layer having a top surface;
a top electrode, on the top surface of the dielectric fill layer;
a sub-lithographic pillar of memory material disposed between the bottom electrode and the top electrode within the dielectric fill layer, the memory material being programmable to a plurality of resistive states by heating;
a heater consisting of a heater material having a resistivity greater than that of the top electrode and greater than that of the memory material in its most highly resistive state disposed on the sub-lithographic pillar of memory material within the dielectric fill layer between the top electrode and the sub-lithographic pillar of memory material, the heater having a top surface in direct contact with the top electrode; and
a programmable resistive change region in the sub-lithographic pillar of memory material selectively programmable by resistively heating the heater so as to convert the programmable resistive change region from a first resistive state to a second resistive state, the programmable resistive change region being confined to a part of the sub-lithographic pillar adjacent to the heater, wherein the sub-lithographic pillar of memory material has a diameter, and the heater has a diameter, wherein the diameter of the heater is the same as the diameter of the sub-lithographic pillar of memory material.

2. The memory device of claim 1, wherein the memory material comprises a combination of Ge, Sb, and Te.

3. The memory device of claim 1, wherein the sub-lithographic pillar of memory material has a height of between about 20 and 120 nm.

4. The memory device of claim 1, wherein the sub-lithographic pillar of memory material has a height of about 80 nm.

5. The memory device of claim 1, wherein the memory material comprises a chalcogenide.

6. The memory device of claim 1, wherein the memory material comprises a combination of two or more materials from the group of Ge, Sb, Te, Se, In, Ti, Ga, Bi, Sn, Cu, Pd, Pb, Ag, S, and Au.

7. The memory device of claim 1, wherein the top electrode comprises a bit line.

8. The memory device of claim 7 wherein the bit line is disposed on the heater.

9. The memory device of claim 1, wherein the heater material comprises at least one of silicon carbide, graphite, tantalum nitride, tantalum-aluminum nitride, tungsten nitride, aluminum oxide and tantalum oxide.

10. A memory device comprising:
a bottom electrode;
a dielectric fill layer;
a top electrode, over the dielectric fill layer;
a sub-lithographic pillar of memory material disposed between the bottom electrode and the top electrode within the dielectric fill layer, the memory material being programmable to a plurality of resistive states by heating;
a heater consisting of a heater material having a resistivity greater than that of the top electrode and greater than that of the memory material in its most highly resistive state disposed on the sub-lithographic pillar of memory material within the dielectric fill layer between the top electrode and the sub-lithographic pillar of memory material, the heater having a top surface in direct contact with the top electrode, wherein the sub-lithographic pillar of memory material has a diameter, and the heater has a diameter, wherein the diameter of the heater is the same as the diameter of the sub-lithographic pillar of memory material; and
a programmable resistive change region in the sub-lithographic pillar of memory material selectively programmable by resistively heating the heater so as to convert the programmable resistive change region from a first resistive state to a second resistive state, the programmable resistive change region being confined to a part of the sub-lithographic pillar adjacent to the heater, wherein the heater material comprises dielectric material not more than 2 nm thick.

11. The memory device of claim 1 wherein the heater material comprises at least one of silicon carbide and graphite.

12. The memory device of claim 1, wherein the top surface of the heater is co-planar with the top surface of the dielectric fill layer.

13. The memory device of claim 10, wherein the top surface of the heater is co-planar with the top surface of the dielectric fill layer.

* * * * *